United States Patent
Li et al.

(10) Patent No.: US 12,035,570 B2
(45) Date of Patent: Jul. 9, 2024

(54) DISPLAY SUBSTRATE, DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Xiang Li, Beijing (CN); Wei He, Beijing (CN); Haowei Zou, Beijing (CN); Shi Shu, Beijing (CN); Chuanxiang Xu, Beijing (CN); Yong Yu, Beijing (CN); Yang Yue, Beijing (CN); Haitao Huang, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 17/417,299

(22) PCT Filed: Sep. 24, 2020

(86) PCT No.: PCT/CN2020/117497
§ 371 (c)(1),
(2) Date: Jun. 22, 2021

(87) PCT Pub. No.: WO2022/061662
PCT Pub. Date: Mar. 31, 2022

(65) Prior Publication Data
US 2022/0328578 A1    Oct. 13, 2022

(51) Int. Cl.
*H10K 59/122*    (2023.01)
*H10K 59/12*    (2023.01)
(Continued)

(52) U.S. Cl.
CPC ......... *H10K 59/122* (2023.02); *H10K 59/124* (2023.02); *H10K 59/38* (2023.02); *H10K 71/00* (2023.02); *H10K 59/1201* (2023.02)

(58) Field of Classification Search
None
See application file for complete search history.

(56) References Cited

U.S. PATENT DOCUMENTS 11,024,686 B2 *   6/2021   Li .................. H10K 50/822
2014/0312312 A1   10/2014  Takii
(Continued)

FOREIGN PATENT DOCUMENTS

CN     107403811 A    11/2017
CN     108538896 A    9/2018
(Continued)

*Primary Examiner* — Evren Seven
*Assistant Examiner* — Cole Leon Lindsey
(74) *Attorney, Agent, or Firm* — Nath, Goldberg & Meyer; Joshua B. Goldberg

(57) ABSTRACT

A display substrate, a display panel and a manufacturing method thereof, and a display device are disclosed. The display substrate includes: a first substrate; a pixel defining layer on the first substrate and having pixel openings; and light emitting devices in one-to-one correspondence with the pixel openings. The light emitting device includes a first electrode and a light emitting function layer, the first electrode is between the pixel defining layer and the first substrate, and includes a main body portion exposed by the pixel opening; the light emitting function layer is in the pixel opening and on a side of the main body portion away from the first substrate, at least a part of the light emitting function layer directly faces the main body portion, and the part of the light emitting function layer directly facing the main body portion is a curved film layer protruding towards the first substrate.

16 Claims, 10 Drawing Sheets

(51) Int. Cl.
*H10K 59/124* (2023.01)
*H10K 59/38* (2023.01)
*H10K 71/00* (2023.01)

(56) References Cited

U.S. PATENT DOCUMENTS

2018/0366672 A1* 12/2018 Wang .................... C09K 11/08
2021/0057678 A1* 2/2021 Motoyama ............. H10K 59/38

FOREIGN PATENT DOCUMENTS

| | | | | |
|---|---|---|---|---|
| CN | 110137380 A | * | 8/2019 | |
| CN | 111670507 A | | 9/2020 | |
| JP | 2005331665 A | * | 12/2005 | ......... H01L 51/5218 |
| JP | 2005331665 A | | 12/2005 | |

* cited by examiner

DISPLAY SUBSTRATE, DISPLAY PANEL, MANUFACTURING METHOD THEREOF AND DISPLAY DEVICE

CROSS-REFERENCE TO RELATED APPLICATION

This is a National Phase Application filed under 35 U.S.C. 371 as a national stage of PCT/CN2020/117497, filed on Sep. 24, 2020, the contents of which are incorporated herein in their entirety by reference.

TECHNICAL FIELD

The present disclosure relates to the field of display technology, in particular to a display substrate, a display panel, a manufacturing method of the display panel and a display device.

BACKGROUND

The display architecture combining a quantum dot layer and an organic light-emitting diode (OLED) can realize higher color gamut, higher resolution and larger viewing angle, and is suitable for the large-size self-luminous display technology.

SUMMARY

The embodiments of the present disclosure provide a display substrate, a display panel, a method of manufacturing the display panel and a display device.

In a first aspect, the embodiments of the present disclosure provide a display substrate, including:

a first substrate;

a pixel defining layer on the first substrate, the pixel defining layer having a plurality of pixel openings; and a plurality of light emitting devices in one-to-one correspondence with the plurality of pixel openings, wherein the light emitting device includes a first electrode and a light emitting function layer, the first electrode is between the pixel defining layer and the first substrate, and includes a main body portion exposed by the pixel opening; the light emitting function layer is in the pixel opening and on a side of the main body portion away from the first substrate, at least a part of the light emitting function layer directly faces the main body portion, and the part of the light emitting function layer directly facing the main body portion is a curved film layer protruding towards the first substrate.

In some embodiments, the display substrate further includes an insulating layer between the pixel defining layer and the first substrate, and a recess is disposed on the insulating layer at a position corresponding to the pixel opening; and the main body portion and the light emitting function layer are both in the recess.

In some embodiments, an inner surface of the recess is an arc-shaped surface, and an included angle between a line from a center to an edge of the inner surface and a thickness direction of the display substrate is greater than 60°.

In some embodiments, an orthographic projection of the light emitting function layer on the first substrate is within an orthographic projection of the recess on the first substrate.

In some embodiments, the light emitting device further includes a second electrode on a side of the light emitting function layer away from the first substrate;

the display substrate further includes:

a thin film transistor between the insulating layer and the first substrate, wherein the first electrode is connected to the thin film transistor through a via hole in the insulating layer, and an encapsulation layer covering the pixel defining layer and the plurality of light emitting devices.

In a second aspect, the embodiments of the present disclosure further provide a display panel, including:

the above display substrate, wherein the plurality of light emitting devices are configured to emit light of a preset color; and a color conversion layer on a light emergent side of the display substrate, wherein the color conversion layer includes a plurality of repeating units, each repeating unit includes a plurality of light emitting portions, each light emitting device corresponds to one light emitting portion, and the light emitting portion is configured to receive light emitted by a corresponding light emitting device and emit light with a same color as or a different color from the preset color.

In some embodiments, the preset color is blue, and the plurality of light emitting portions in a same repeating unit include: a red light emitting portion, a green light emitting portion and a blue light emitting portion, a material of the red light emitting portion includes a red quantum dot material, a material of the green light emitting portion includes a green quantum dot material, and a material of the blue light emitting portion includes a scattering particle material.

In some embodiments, a surface of the light emitting portion away from the display substrate is a convex surface.

In some embodiments, an accommodating structure layer is further disposed on the light emergent side of the display substrate, the accommodating structure layer has a plurality of accommodating grooves, the plurality of accommodating grooves are in one-to-one correspondence with the plurality of light emitting devices, and the plurality of light emitting portions are in the plurality of accommodating grooves.

In some embodiments, a portion of the accommodating structure layer that is in contact with the light emitting portion is made of a hydrophobic material.

In some embodiments, the display panel further includes:

a color filter layer on a side of the color conversion layer away from the display substrate, wherein the color filter layer includes a plurality of color filter portions, the plurality of color filter portions are in one-to-one correspondence with the plurality of light emitting portions, and color of the color filter portion is the same as color of light emitted from a corresponding light emitting portion; and a black matrix between the accommodating structure layer and the display substrate or on a side of the color conversion layer away from the display substrate; wherein an orthographic projection of at least a part of each light emitting portion on the first substrate does not overlap with an orthographic projection of the black matrix on the first substrate.

In a third aspect, the embodiments of the present disclosure further provide a method of manufacturing a display panel, including: manufacturing a display substrate, wherein manufacturing the display substrate includes:

forming first electrodes of a plurality of light emitting devices on a first substrate, the first electrodes each including a main body portion;

forming a pixel defining layer, wherein the pixel defining layer has a plurality of pixel openings, the first electrodes are in one-to-one correspondence with the plurality of pixel openings, and the main body portion is exposed by the pixel opening; and forming light emitting function layers of the plurality of the light emitting devices, wherein the light emitting function layers are in the pixel openings and on a side of the main body portions away from the first substrate, at least a part of the light emitting function layer directly faces the main body portion, and the part of the light emitting function layer directly facing the main body portion is a curved film layer protruding toward the first substrate; and the method further includes:

forming a color conversion layer on a light emergent side of the display substrate, wherein the color conversion layer includes a plurality of repeating units, each repeating unit includes a plurality of light emitting portions, each light emitting device corresponds to one light emitting portion, and the light emitting portion is configured to receive light emitted by a corresponding light emitting device and emit light with a same color as or a different color from the preset color.

In some embodiments, manufacturing a display substrate further includes:

before forming first electrodes of a plurality of light emitting devices, forming an insulating layer on the first substrate, wherein a recess is formed on the insulating layer at a position corresponding to the pixel opening;

wherein the main body portion and the light emitting function layer are both in the recess.

In some embodiments, forming a color conversion layer on a light emergent side of the display substrate includes:

forming an accommodating structure layer on the light emergent side of the display substrate, wherein the accommodating structure layer has a plurality of accommodating grooves, and the plurality of accommodating grooves are in one-to-one correspondence with the plurality of light emitting devices; and forming a light emitting portion in each accommodating groove by ink jet printing;

wherein the preset color is blue, and the plurality of light emitting portions in a same repeating unit include: a red light emitting portion, a green light emitting portion and a blue light emitting portion; a material of the red light emitting portion includes a red quantum dot material, a material of the green light emitting portion includes a green quantum dot material, and a material of the blue light emitting portion includes a scattering particle material.

In some embodiments, the accommodating structure layer is made of a hydrophobic material, so that a surface of the light emitting portion away from the display substrate is formed to be a convex surface.

In some embodiments, forming a color conversion layer on a light emergent side of the display substrate includes:

forming an accommodating structure layer on a second substrate, wherein the accommodating structure layer has a plurality of accommodating grooves, and the plurality of accommodating grooves are in one-to-one correspondence with the plurality of light emitting devices;

forming a light emitting portion in each accommodating groove by ink jet printing; wherein the preset color is blue, and the plurality of light emitting portions in a same repeating unit include: a red light emitting portion, a green light emitting portion and a blue light emitting portion; a material of the red light emitting portion includes a red quantum dot material, a material of the green light emitting portion includes a green quantum dot material, and a material of the blue light emitting portion includes a scattering particle material; and aligning the second substrate and the display substrate to form a cell, such that the light emitting portion is aligned with a corresponding light emitting device.

In a fourth aspect, the embodiments of the present disclosure further provide a display device, including the above display panel.

BRIEF DESCRIPTION OF THE DRAWINGS

The accompanying drawings, which serve to provide a further understanding of the present disclosure and constitute a part of this specification, are used to explain the present disclosure together with the following embodiments, but do not constitute a limitation of the present disclosure. In the drawings.

DETAILED DESCRIPTION

To make objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a part, not all, of embodiments of the present disclosure. All other embodiments, which can be derived by a person skilled in the art from the described embodiments of the present disclosure without inventive effort, are within the protection scope of the present disclosure.

The terminology used herein to describe embodiments of the present disclosure is not intended to limit and/or define the scope of the present disclosure. For example, unless defined otherwise, technical or scientific terms used in this disclosure should have the same meaning as commonly understood by one of ordinary skill in the art to which this invention belongs. It should be understood that the terms "first", "second", and the like, as used in this disclosure, do not denote any order, quantity, or importance, but rather are used to distinguish one element from another. The singular forms "a", "an", "the" and the like do not denote a limitation of quantity, but rather denote the presence of at least one, unless the context clearly indicates otherwise. The word "include", "comprise", or the like, means that the element or item appearing in front of the word "include" or "comprise" encompasses the element or item listed after the word "include" or "comprise" and its equivalents, and does not exclude other elements or items. The terms "connected", "coupled" and the like are not restricted to physical or mechanical connections, but may include electrical connections, whether direct or indirect. "upper", "lower", "left", "right", and the like are used merely to indicate relative positional relationships, which may also change accordingly when an absolute position of an object being described changes.

In the following description, when an element or layer is referred to as being "on" or "connected to" another element or layer, it may be directly on or directly connected to the other element, or an intermediate element or layer may be present. However, when an element or layer is referred to as being "directly on" or "directly connected to" another element or layer, there is no intermediate element or layer. The term "and/or" includes any and all combinations of one or more of the associated listed items.

Figure 1:
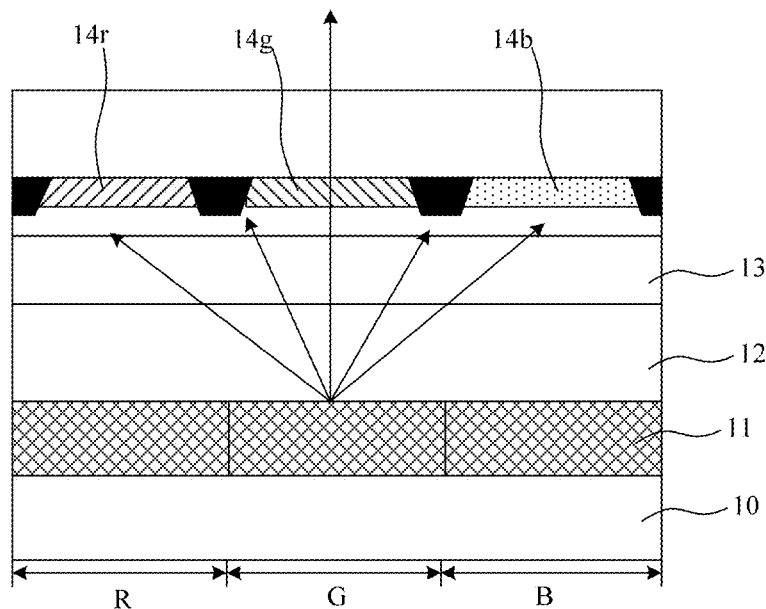
FIG. 1 is a schematic diagram of a display panel in a comparative example.
Figure 2:
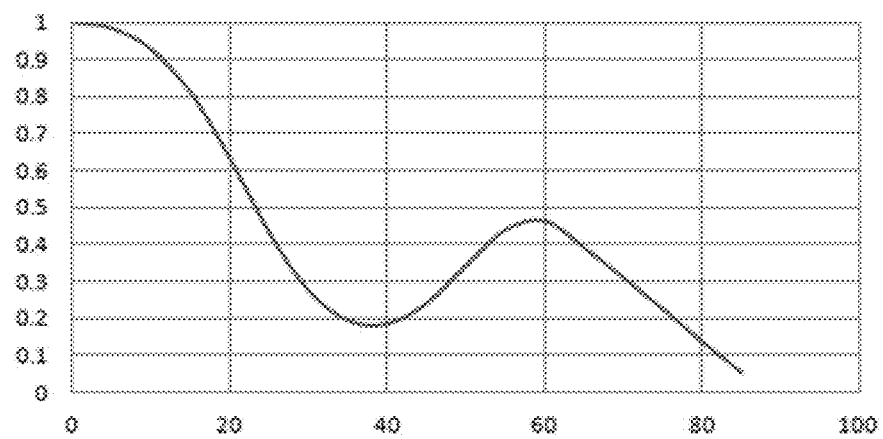
FIG. 2 is a graph of light field distribution of a light emitting device.

FIG. 1 is a schematic diagram of a display panel in a comparative example, and arrows in FIG. 1 indicate light rays. As shown in FIG. 1, the display panel includes red, green and blue sub-pixel regions R, G and B. The display panel includes a plurality of light emitting devices 11 emitting blue light, which are disposed on a substrate 10. In addition, the display panel further includes a plurality of light emitting portions, which specifically include: a red light emitting portion 14r corresponding to the red sub-pixel region R, a green light emitting portion 14g corresponding to the green sub-pixel region G, and a blue light emitting portion 14b corresponding to the blue sub-pixel region B. The red light emitting portion 14r and the green light emitting portion 14g may be quantum dot layers, and the blue light emitting portion 14b may be a scattering particle layer. During display, the light emitting device 11 emits light, the red light emitting portion 14r emits red light under the excitation of blue light, the green light emitting portion 14g emits green light under the excitation of blue light, and the blue light emitting portion 14b in the blue sub-pixel region B allows blue light to directly pass therethrough. As such, three primary colors of red, green and blue are produced. The light from the light emitting device 11 is not fully collimated, but some large-angle light is generated. FIG. 2 is a graph of light field distribution of the light emitting device, with a vertical axis representing a ratio of actual light intensity to central light intensity, and a horizontal axis representing a light emitting angle, i.e., an included angle between a light emitting direction and a thickness direction of the display panel. It can be seen that the light emitting device can generate strong light intensity when the light emitting angle is about 60°. In addition, since an encapsulation layer 12, a filling layer 13, and the like are further disposed between the light emitting device 11 and an optical filter, light emitted by the light emitting device 11 is not only irradiated to a corresponding light emitting portion, but also irradiated to an adjacent light emitting portion, thereby causing color crosstalk between different sub-pixel regions.

Figure 3A:
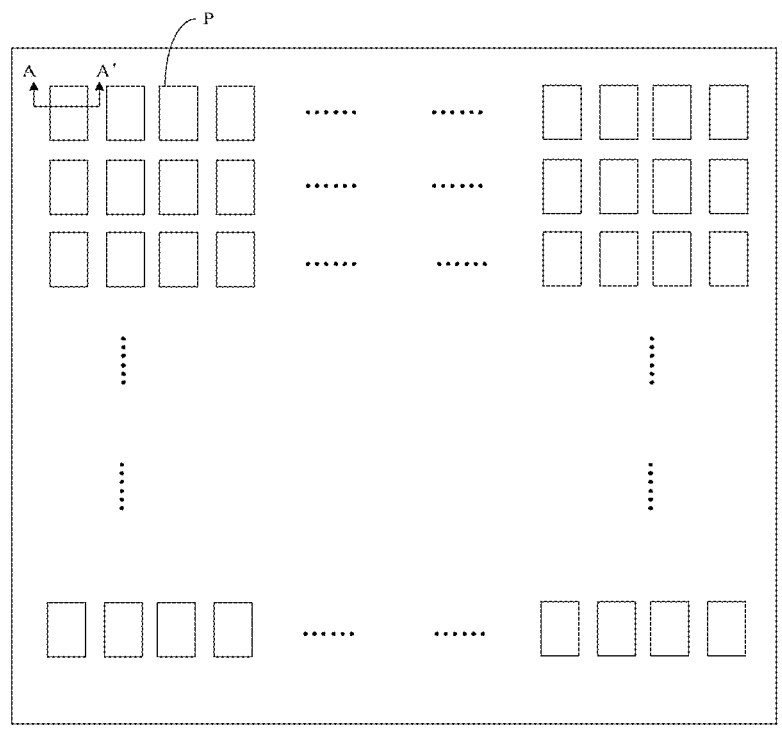
FIG. 3A is a plan view of a display substrate in some embodiments of the present disclosure.
Figure 3B:
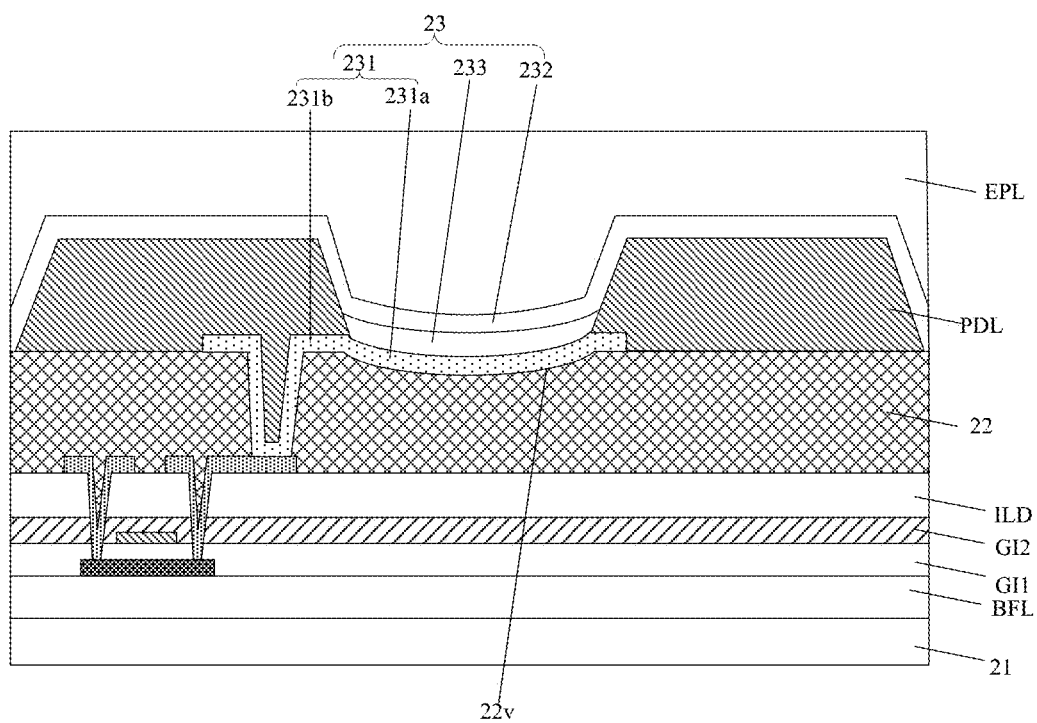
FIG. 3B is a cross-sectional view taken along line A-A' in FIG. 3A.

FIG. 3A is a plan view of a display substrate in some embodiments of the present disclosure and FIG. 3B is a cross-sectional view taken along line A-A' in FIG. 3A. The display substrate may be used in a display panel having a color conversion layer. As shown in FIG. 3A, the display substrate includes a plurality of sub-pixel regions P. As shown in FIG. 3B, the display substrate may include: a first substrate 21, a pixel defining layer PDL and a plurality of light emitting devices 23, and the plurality of light emitting devices 23 are in one-to-one correspondence with the plurality of sub-pixel regions.

The first substrate 21 may be a glass substrate, or may be a flexible substrate made of a flexible material such as polyimide (PI), so as to facilitate achievement of flexible display.

The pixel defining layer PDL is located on a side of an insulating layer away from the first substrate 21, and has a plurality of pixel openings located in the sub-pixel regions P.

The plurality of light emitting devices 23 are in one-to-one correspondence with the plurality of the pixel openings, and the light emitting device 23 includes: a first electrode 231, a second electrode 232, and a light emitting function layer 233 between the first electrode 231 and the second electrode 232. For example, the first electrode 231 is an anode and the second electrode 232 is a cathode. Optionally, the first electrode 231 is a reflective electrode made of a metal material, and the second electrode 232 is a transparent electrode made of a transparent conductive material (e.g., indium tin oxide). The light emitting function layer 233 may include: a hole injection layer, a hole transport layer, a light emitting layer, an electron transport layer, and an electron injection layer, which are sequentially stacked. The first electrode 231 is located between the pixel defining layer PDL and the first substrate 21, and the first electrode 231 includes a main body portion 231a exposed by the pixel opening. The light emitting function layer 233 is located in the pixel opening and on a side of the main body portion 231a away from the first substrate 21. At least a part of the light emitting function layer 233 directly faces the main body portion 231a, and the part of the light emitting function layer 233 directly facing the main body portion 231a is a curved film layer protruding toward the first substrate 21. Optionally, the light emitting device 23 is an OLED device, and in this case, the light emitting layer is made of an organic light emitting material; alternatively, the light emitting device 23 is a quantum dot light emitting diode (QLED) device, and in this case, the light emitting layer is made of a quantum dot light emitting material.

It should be noted that the expression "at least a part of the light emitting function layer 233 directly faces the first electrode 231" means that an orthographic projection of at least a part of the light emitting function layer 233 on the first substrate 21 is located within an orthographic projection of the main body portion 231a on the first substrate 21. Accordingly, the part of the light emitting function layer 233 directly facing the main body portion 231a refers to a part of the light emitting function layer 233 whose orthographic projection falls within the orthographic projection of the main body portion 231a.

It should also be noted that the expression "the part of the light emitting function layer 233 directly facing the main body portion 231a is a curved film layer protruding toward the first substrate 21" means that both upper and lower surfaces of the part of the light emitting function layer 233 directly facing the main body portion 231a are curved toward the first substrate 21.

In the light emitting device 23, when a current is generated between the first electrode 231 and the second electrode 232, the light emitting function layer 233 emits light, and a light emitting region of the light emitting function layer 233 is a region of the light emitting function layer 233 directly facing the main body portion 231a of the first electrode 231. In the embodiment of the present disclosure, the part of the light emitting function layer 233 directly facing the main body portion 231a is a curved film layer protruding toward the first substrate 21, in this case, light at the edge of the light emitting region of the light emitting function layer 233 converges toward the middle, and therefore, compared with FIG. 1, the light emitting angle of the light emitting device 23 in the embodiments of the present disclosure is decreased, thereby reducing or preventing the crosstalk phenomenon.

The display substrate in the embodiments of the present disclosure may be used in a display device having a color conversion layer, and the color conversion layer may be provided therein with scattering particles. In this case, after the light from the light emitting device 23 passes through the color conversion layer, the light exits in different directions under the scattering effect of the scattering particles. Thus, although the light emitting angle of the light emitting device 23 is decreased, the viewing angle of the display device is not affected.

In addition, the display substrate may further include a pixel circuit configured to supply a driving current to the light emitting device 23 to drive the light emitting device 23 to emit light. For example, the pixel circuit includes a plurality of thin film transistors 24 (as shown in FIG. 3B) and at least one capacitor.

The thin film transistor 24 includes a gate electrode 241, an active layer 242, a source electrode 243 and a drain electrode 244. By taking the case that the thin film transistor 24 is a top gate thin film transistor as an example, the active layer 242 is located between the gate electrode 241 and the first substrate 21. A material of the active layer 242 may include, for example, an inorganic semiconductor material (e.g., polysilicon, amorphous silicon, etc.), an organic semiconductor material, or an oxide semiconductor material. The active layer 242 includes a channel portion and source and drain connection portions respectively at both sides of the channel portion, the source connection portion is connected to the source electrode 243 of the thin film transistor 24, and the drain connection portion is connected to the drain electrode 244 of the thin film transistor 24. Each of the source connection portion and the drain connection portion may be doped with an impurity (e.g., an N-type impurity or a P-type impurity) at a higher impurity concentration than the channel portion. The channel portion directly faces the gate electrode 241 of the thin film transistor 24, and when a voltage signal applied to the gate electrode 241 reaches a certain value, a carrier path is formed in the channel portion, and the source electrode 243 and the drain electrode 244 of the thin film transistor 24 are electrically connected.

A buffer layer BFL is disposed between the thin film transistor 24 and the first substrate 21, and serves to prevent or reduce diffusion of metal atoms and/or impurities from the first substrate 21 into the active layer 242 of the transistor. The buffer layer BFL may include an inorganic material such as silicon oxide (SiOx), silicon nitride (SiNx), and/or silicon oxynitride (SiON), and may be formed as multiple layers or a single layer.

A first gate insulating layer GI1 is disposed on a side of the active layer 242 away from the first substrate 21. A material of the first gate insulating layer GI1 may include a silicon compound or a metal oxide. For example, the material of the first gate insulating layer GI1 includes silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. In addition, the first gate insulating layer GI1 may have a single layer or multiple layers.

A first gate electrode layer is disposed on a side of the first gate insulating layer GI1 away from the first substrate 21. The first gate electrode layer includes the gate electrode 241 of each thin film transistor and a first electrode plate of the capacitor. A material of the first gate electrode layer may include, for example, a metal, a metal alloy, a metal nitride, a conductive metal oxide, a transparent conductive material, or the like. For example, the first gate electrode layer G1 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin Oxide (ITO), indium zinc oxide (IZO), or the like. The first gate electrode layer may have a single layer or multiple layers.

A second gate insulating layer GI2 is disposed on a side of the first gate electrode layer away from the first substrate 21, and a material of the second gate insulating layer GI2 may include, for example, a silicon compound or a metal oxide. For example, the material of the second gate insulating layer GI2 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. The second gate insulating layer GI2 may be formed as a single layer or multiple layers.

A second gate electrode layer (not shown) is disposed on a side of the second gate insulating layer GI2 away from the first substrate 21, and the second gate electrode layer may include a second electrode plate of the capacitor. A material of the second gate electrode layer may be the same as that of the first electrode plate, and the conductive materials enumerated hereinabove may be referred to.

An interlayer insulating layer ILD is disposed on a side of the second gate electrode layer away from the first substrate 21, and a material of the interlayer insulating layer ILD may include, for example, a silicon compound, a metal oxide, or the like. In particular, the silicon compounds and metal oxides listed above may be selected and will not be described in detail here.

A source-drain conductive layer is disposed on a side of the interlayer insulating layer ILD away from the first substrate 21. The source-drain conductive layer may include the source electrode 243 and the drain electrode 244 of each transistor, the source electrode 243 is electrically connected to the source connection portion, and the drain electrode 244 is electrically connected to the drain connection portion. The source-drain conductive layer may include a metal, an alloy, a metal nitride, a conductive metal oxide, a transparent conductive material, or the like. For example, the source-drain conductive layer may be a single layer or multiple layers formed of a metal, such as Mo/Al/Mo or Ti/Al/Ti.

An insulating layer 22 is disposed on a side of the source-drain conductive layer away from the first substrate 21, and the insulating layer 22 may be made of an organic insulating material. For example, the organic insulating material includes a resin material such as polyimide, epoxy resin, acryl, polyester, photoresist, polyacrylate, polyamide, or siloxane. As another example, the organic insulating material includes an elastic material, such as ethyl carbamate, thermoplastic polyurethane (TPU), or the like.

In some embodiments, in order to facilitate formation of a curve shape of at least a part of the light emitting function layer 233, as shown in FIG. 3B, a recess 22v is provided on the insulating layer 22 at a position corresponding to the pixel opening, and the main body portion 231a of the first electrode 231 and the light emitting function layer 233 are located in the recess 22v, so that the main body portion 231a of the first electrode 231 and the light emitting function layer 233 are conformal with the recess 22v. The first electrode 231 further includes a connection portion 231b connected to the main body portion 231a, an orthographic projection of the connection portion 231b on the first substrate 21 is located outside an orthographic projection of the recess 22v on the first substrate 21, and the connection portion 231b is connected to the drain electrode 244 of the transistor through a via hole in the insulating layer 22.

The shape of the recess 22v is not particularly limited in the embodiments of the present disclosure, for example, an inner surface of the recess 22v is an arc-shaped surface; for another example, a longitudinal section of the recess 22v is an inverted trapezoid.

Figure 4:
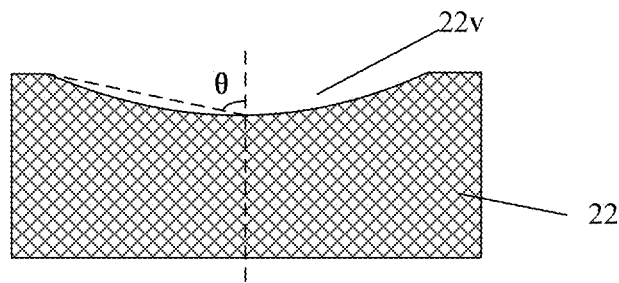
FIG. 4 is a schematic diagram of a shape of a recess in an embodiment of the present disclosure.

FIG. 4 is a schematic diagram showing a shape of the recess in an embodiment of the present disclosure, and as shown in FIG. 4, in some embodiments, an inner surface of the recess 22v is an arc-shaped surface, and an included angle θ between a line connecting a center to an edge of the inner surface of the recess 22v and the thickness direction of the display substrate is greater than 60°, so as to prevent the first electrode 231 from being broken while alleviating crosstalk.

The pixel defining layer PDL is located on a side of the layer where the first electrode 231 is located away from the first substrate 21, and has pixel openings in one-to-one correspondence with the light emitting devices 23, and the pixel opening exposes the main body portion 231a of the corresponding first electrode 231. The light emitting function layers 233 are disposed in the pixel openings in one-to-one correspondence. An orthographic projection of the opening of the recess 22v on the first substrate 21 may coincide with an orthographic projection of the bottom of the pixel opening on the first substrate 21.

In some embodiments, the pixel defining layer PDL may be made of a material having a relatively high reflectivity, so as to reduce absorption of light from the light emitting device 23 and improve light utilization rate. Optionally, the reflectivity of the pixel defining layer PDL is greater than 8%, for example, the reflectivity of the pixel defining layer PDL is about 10%, and for another example, the reflectivity of the pixel defining layer PDL is about 20%; for another example, the reflectivity of the pixel defining layer PDL is about 40%; for another example, the reflectivity of the pixel defining layer PDL is about 50%. The reflectivity of the pixel defining layer refers to the reflectance of light emitted by the light emitting device.

In some examples, the pixel defining layer PDL includes a matrix and reflective particles disposed in the matrix, the reflective particles having a reflectivity greater than a reflectivity of the matrix. For example, a material of the matrix includes: polyimide resin, acryl resin, etc., and a material of the reflective particles includes silicon oxide, silicon nitride, etc.

In some embodiments, the orthographic projection of the light emitting function layer 233 on the first substrate 21 is located within the orthographic projection of the recess 22v on the first substrate 21, so that when a current flows between the first electrode 231 and the second electrode 232, the whole light emitting function layer 233 emits light, and light emitted from the edge of the light emitting function layer 233 is converged toward the middle, thereby reducing the overall light emitting angle of the light emitting function layer 233.

The second electrode 232 of the light emitting device 23 is located on the side of the light emitting function layer 233 away from the first substrate 21. The second electrodes 232 of the plurality of light emitting devices 23 may be connected as a one-piece structure.

As shown in FIG. 3B, the display substrate further includes: an encapsulation layer EPL covering the pixel defining layer PDL and the light emitting devices 23, and is configured to encapsulate the light emitting devices 23 to prevent moisture and/or oxygen in the external environment from corroding the light emitting devices 23. In some embodiments, the encapsulation layer EPL includes a first inorganic encapsulation layer, a second inorganic encapsulation layer located on a side of the first inorganic encapsulation layer away from the first substrate 21, and an organic encapsulation layer located between the first inorganic encapsulation layer and the second inorganic encapsulation layer. The first inorganic encapsulation layer and the second inorganic encapsulation layer may be both made of an inorganic material with high compactness, such as silicon oxynitride (SiON), silicon oxide (SiOx), silicon nitride (SiNx) or the like. The organic encapsulation layer may be made of a high polymer material containing a desiccant or a high polymer material capable of blocking moisture. For example, a polymer resin may be used to relieve stress of the first inorganic encapsulation layer and the second inorganic encapsulation layer, and a water-absorbing material such as a desiccant may also be included to absorb water, oxygen, and the like that have intruded into the inside.

Figure 5:
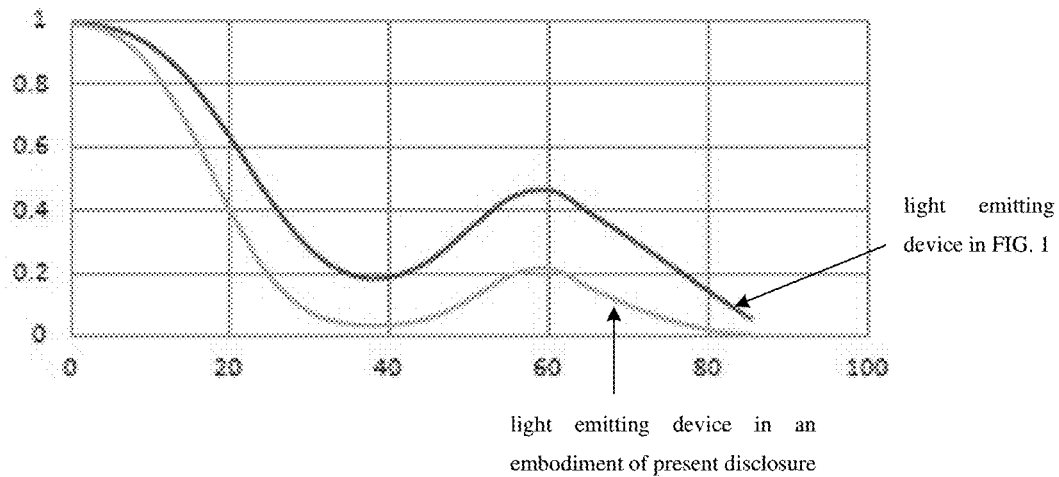
FIG. 5 is a graph showing a comparison between light field distribution of a light emitting device in a display substrate in an embodiment of the present disclosure and light field distribution of the light emitting device in FIG. 1.

FIG. 5 is a graph showing a comparison between light field distribution of the light emitting device in the display substrate in the embodiment of the present disclosure and light field distribution of the light emitting device in FIG. 1, and as shown in FIG. 5, in the display substrate provided in the embodiment of the present disclosure, the light emitting intensity of the light emitting device at a large angle is decreased, so that crosstalk between pixels can be reduced.

Figure 6:
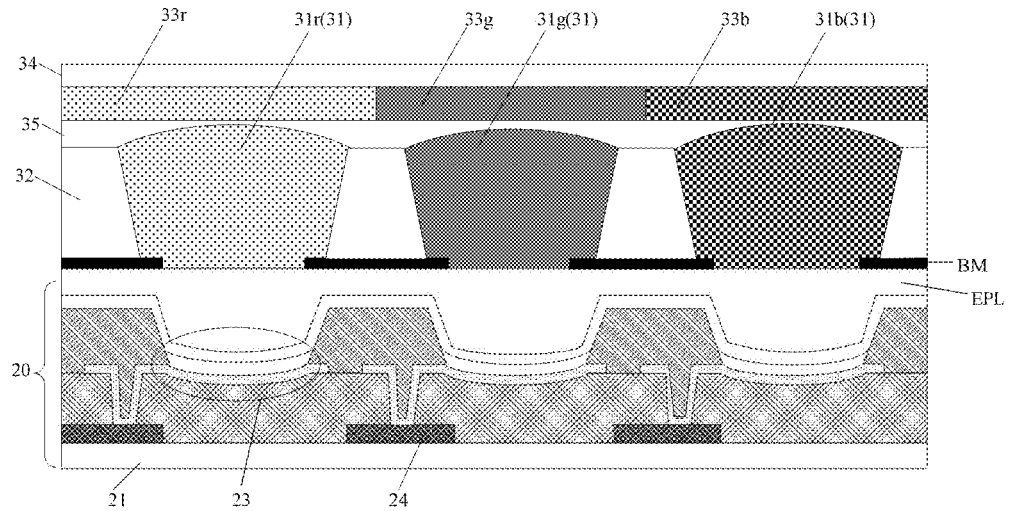
FIG. 6 is a schematic diagram of a display panel in some embodiments of the present disclosure.

FIG. 6 is a schematic diagram of a display panel in some embodiments of the present disclosure. As shown in FIG. 6, the display panel includes: the display substrate described above and a color conversion layer located on a light emergent side of the display substrate. The light emergent side of the display substrate is a light emergent side of the light emitting device. The color conversion layer includes a plurality of repeating units, each of which includes a plurality of light emitting portions 31, and each light emitting device 23 corresponds to one light emitting portion 31.

In some embodiments, the light emitting device 23 is configured to emit light of a preset color, and the light emitting portion 31 is configured to receive the light emitted by the corresponding light emitting device 23 and emit light of the same color as or different color from the preset color. Optionally, the light emitted from the plurality of light emitting portions 31 in a same repeating unit have different colors from each other. For example, the plurality of light emitting portions 31 in a same repeating unit emit red light, blue light, and green light, respectively. Alternatively, the colors of the light emitted from at least two light emitting portions 31 in a same repeating unit are different, for example, one repeating unit includes four light emitting portions 31, and the colors of the light emitted from the four light emitting portions 31 are: red, green, green, and blue.

In some embodiments, the preset color is blue. The plurality of light emitting portions in a same repeating unit may include: a red light emitting portion 31*r*, a green light emitting portion 31*g*, and a blue light emitting portion 31*b*. Each of the red light emitting portion 31*r* and the green light emitting portion 31*g* is a quantum dot layer, and the blue light emitting portion 31*b* is a scattering film layer.

Specifically, a material of the red light emitting portion 31*r* includes a red quantum dot material, a material of the green light emitting portion 31*g* may include a green quantum dot material, and a material of the blue light emitting portion 31*b* includes a scattering particle material. The red quantum dot material is used for emitting red light under excitation of blue light emitted by the light emitting device 23; the green quantum dot material is used for emitting green light under excitation of blue light emitted by the light emitting device 23. The red quantum dot material and the green quantum dot material may be at least one of indium phosphide (InP), zinc oxide (ZnO), graphene, cadmium selenide (CdSe), cadmium sulfide (CdS), cadmium telluride (CdTe), zinc selenide (ZnSe), zinc telluride (ZnTe) or zinc sulfide (ZnS). The emitting color of the quantum dot material may be controlled by controlling a particle size of the quantum dot material. For example, the red quantum dot material and the green quantum dot material are both zinc sulfide, and in this case, the particle size of the red quantum dot material is between 9 nm and 10 nm, so that red light is emitted; the particle size of the green quantum dot material is between 6.5 nm and 7.5 nm, so that green light is emitted. The material of the blue light emitting portion 31*b* includes the scattering particle material to scatter the received blue light.

In addition, the red light emitting portion 31*r* and the green light emitting portion 31*g* may be doped with scattering particles. As such, each light emitting portion 31 can emit light at a large angle even if the light emitting angle of the light emitting device 23 is small, under the scattering effect of the scattering particles.

An accommodating structure layer 32 is further disposed on the light emergent side of the display substrate 20, and has a plurality of accommodating grooves, the plurality of accommodating grooves are in one-to-one correspondence with the plurality of light emitting devices 23, and the light emitting portions 31 are disposed in the accommodating grooves. The accommodating structure layer 32 may be made of a photosensitive material, to facilitate manufacturing. In addition, the accommodating structure layer 32 may be made of a material with high reflectivity, so as to improve the light utilization rate.

Figure 7:
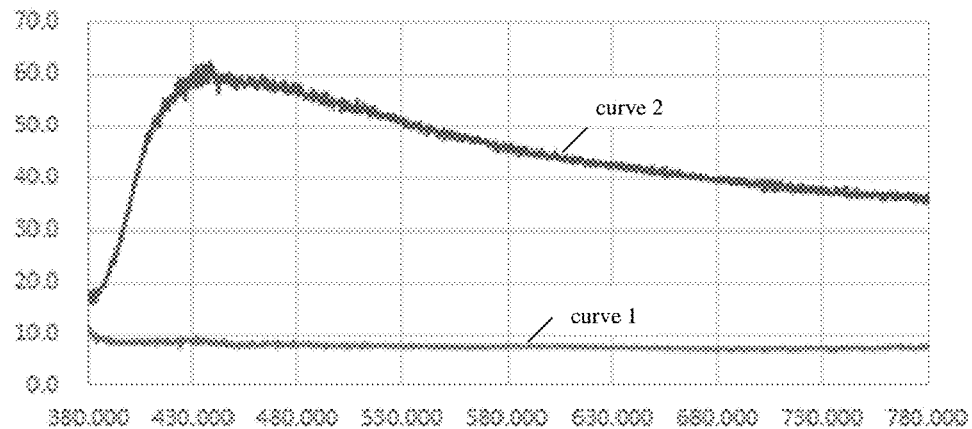
FIG. 7 is a graph showing reflectivities of two accommodating structure layers in an embodiment of the present disclosure.

FIG. 7 is a graph showing reflectivities of two accommodating structure layers in an embodiment of the present disclosure, in which a horizontal axis represents light wavelength, and a vertical axis represents reflectivity. Curve 1 in FIG. 7 is a reflectivity curve in the case that the accommodating structure layer is made of an acrylic resin or a polyimide resin, and curve 2 in FIG. 7 is a reflectivity curve in the case that the material of the accommodating structure layer includes a resin and reflective particles that are doped in the resin and may be silicon oxide particles, silicon nitride particles, or the like. In practical applications, the material of the pixel defining layer may be selected according to practical requirements.

In some embodiments, a surface of the light emitting portion 31 away from the display substrate 20 is a convex surface. It should be noted that the convex surface bulges toward the outside of the light emitting portion 31, so that the light emitting portion 31 forms a convex lens structure. This arrangement can improve the brightness of the display panel from a front viewing angle.

In order to facilitate the manufacture of the light emitting portion 31 having a convex surface, in some embodiments, a portion of the accommodating structure layer 32 in contact with the light emitting portion 31 is made of a hydrophobic material. In some examples, the accommodating structure layer 32 is made of a hydrophobic material as a whole. In this case, when forming the light emitting portion 31, the accommodating structure layer 32 having accommodating grooves may be first formed on the display substrate 20 using the hydrophobic material, then the solution for forming the light emitting portion 31 is printed in the accommodating grooves, the solution in the accommodating grooves is formed into a structure with a convex top under the hydrophobic effect of the hydrophobic structure layer, and then after curing, the light emitting portion 31 with a convex top surface is formed. In other examples, the accommodating structure layer 32 includes a body and a hydrophobic film layer disposed on the body, the light emitting portion 31 is in contact with the hydrophobic film layer, and a material of the body is not limited.

In some examples, the hydrophobicity of the hydrophobic material satisfies the following criteria: for example, when propylene glycol methyl ether acetate (PGMEA) is in contact with the hydrophobic material, a contact angle of the PGMEA is greater than 60° so as to facilitate formation of the top surface of the light emitting portion 31 as a convex surface.

Since the external ambient light also contains blue light, when the blue light in the external ambient light is incident into the red light emitting portion 31*r* and the green light emitting portion 31*g*, the red light emitting portion 31*r* and the green light emitting portion 31*g* are excited to emit light, thereby affecting the display effect of the display panel. In order to prevent the display of the display panel from being interfered by the external ambient light, in some embodiments, the display panel further includes a color filter layer and a black matrix BM. The color filter layer is located on a side of the color conversion layer away from the display substrate 20, and includes a plurality of color filter portions 33*r*, 33*g* and 33*b*. The plurality of color filter portions 33*r*/33*g*/33*b* are in one-to-one correspondence with the plurality of light emitting portions 31. The color of light emitted from the color filter portion 33*r*/33*g*/33*b* is the same as that of light emitted from the corresponding light emitting portion 31, for example, the color of light emitted from the color filter portion 33r is the same as the color of light emitted from the red light emitting portion 31r, the color of light emitted from the color filter portion 33g is the same as the color of light emitted from the green light emitting portion 31g, and the color of light emitted from the color filter portion 33b is the same as the color of light emitted from the blue light emitting portion 31b. The black matrix BM is located between the accommodating structure layer 32 and the display substrate 20, and is formed as a mesh structure to define the plurality of sub-pixel regions, i.e., regions where the light emitting devices 23 are located. An orthographic projection of at least a part of each light emitting portion 31 on the first substrate 21 does not overlap with an orthographic projection of the black matrix BM on the first substrate 21.

In addition, a filling layer 35, such as an optical adhesive layer, may be disposed between the light emitting portions 31 and the color filter layer, so that the color filter layer can be located on a flat surface. A protective layer 34 may also be disposed on a side of the color filter layer away from the display substrate 20 to protect the color filter layer and the structures below the color filter layer.

For the display panel shown in FIG. 6, in the manufacturing process, after the display substrate is manufactured, the black matrix BM may be first formed on the encapsulation layer of the display substrate, and then the accommodating structure layer 32 having the accommodating grooves is formed; afterwards, the light emitting portions 31 are formed in the accommodating grooves; subsequently, the filling layer 35, the color filter layer, and the protective layer 34 are sequentially formed.

Figure 8:
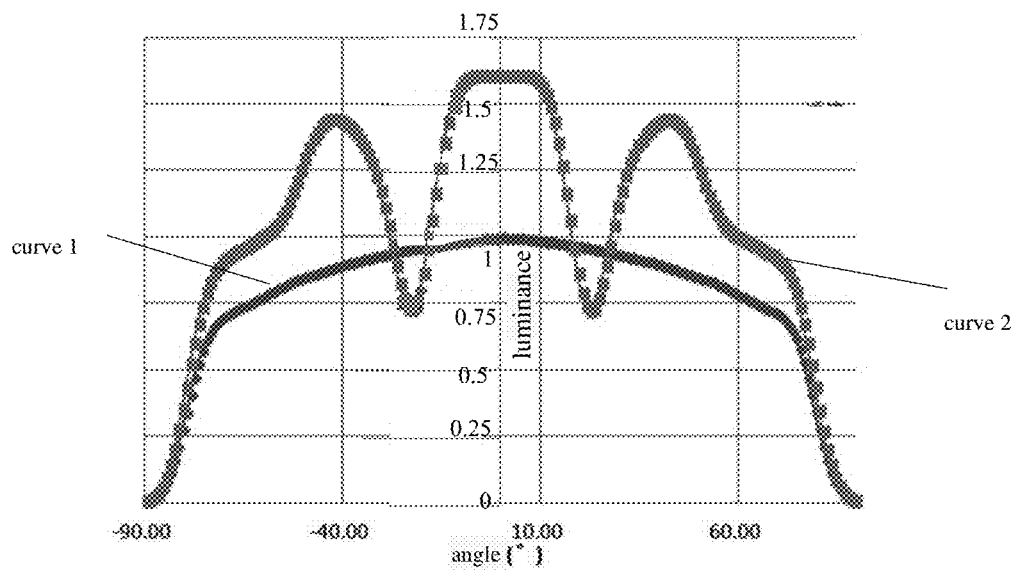
FIG. 8 is a graph showing luminance distributions of light from a test light source before and after passing through a convex lens.

FIG. 8 is a graph showing luminance distributions of light from a test light source before and after passing through a convex lens, in which a horizontal axis represents a viewing angle, and a vertical axis represents normalized luminance of light. In FIG. 8, curve 1 shows the relationship between the luminance of light from the test light source and the viewing angle; curve 2 shows the relationship between the luminance of the light from the test light source after passing through the convex lens and the viewing angle. The test light source is a light source for testing, and specifically may be an LED or an OLED. The convex lens is a convex lens for testing, and the shape of the convex lens is the same as that of the light emitting portion 31. As can be seen from FIG. 8, the difference in luminance between different viewing angles is small before the light from the test light source reaches the convex lens; after the light from the test light source passes through the convex lens, the luminance at the front viewing angle (i.e., at a position where the viewing angle is relatively small) is increased. Similarly, when the light emitting portion 31 is formed as a convex structure, the luminance at the front viewing angle of the display panel can be increased.

Figure 9:
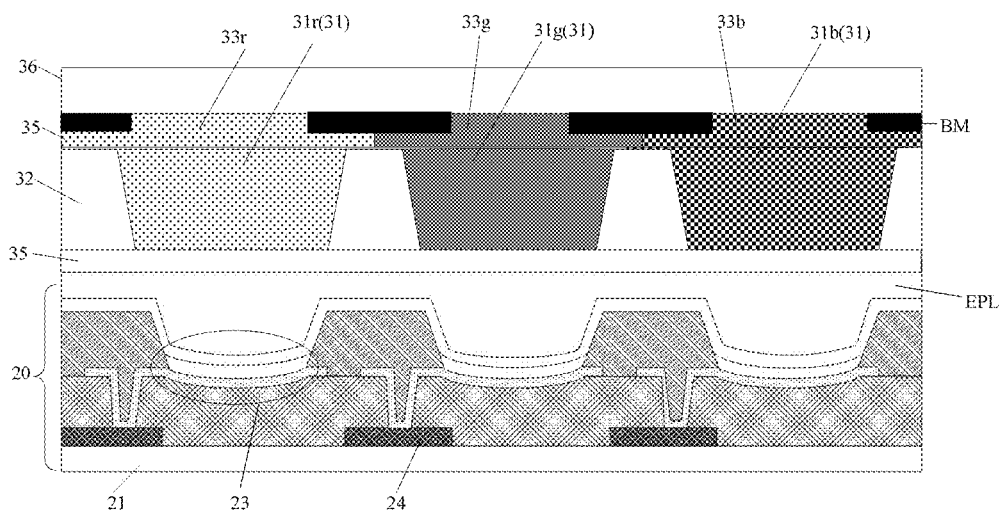
FIG. 9 is a schematic diagram of a display panel in another embodiment of the present disclosure.

FIG. 9 is a schematic diagram of a display panel in some other embodiment of the present disclosure. As shown in FIG. 9, in some other embodiment, the display panel also includes a color filter layer and a black matrix BM, and the color filter layer is located on the side of the color conversion layer away from the display substrate 20. Unlike FIG. 6, in FIG. 9, the color filter layer is disposed on a second substrate 36 and is located on a side of the second substrate 36 facing the first substrate 21, and the black matrix BM is located on the side of the color conversion layer away from the display substrate 20. In FIG. 9, a surface of the light emitting portion 31 away from the first substrate 21 is a flat surface, and the filling layer is disposed between the light emitting portion 31 and the display substrate 20.

For the display panel in FIG. 9, in the manufacturing process, the black matrix BM, the color filter layer, the accommodating structure layer 32, and the light emitting portions 31 may be formed on the second substrate 21, thereby obtaining a counter substrate; then, the filling layer 35 is formed on the display substrate 20 or on the counter substrate, and the display substrate 20 and the counter substrate are aligned to form a cell, thereby forming a display panel.

Figure 10:
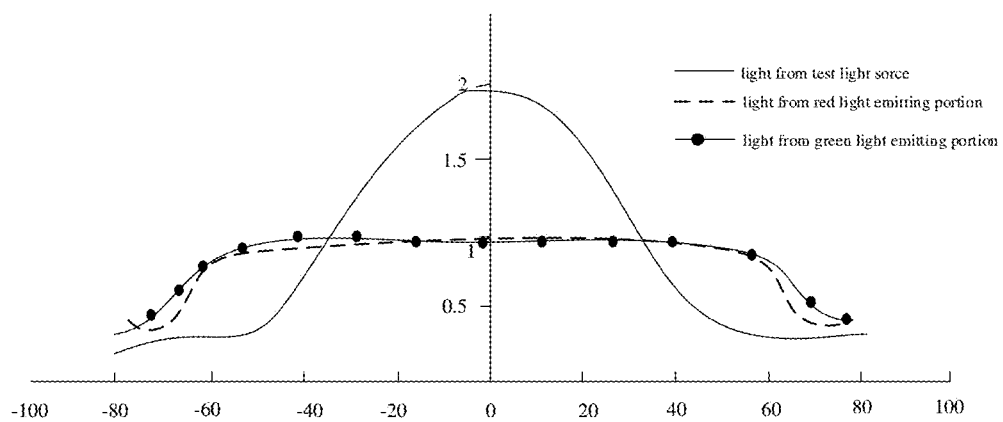
FIG. 10 is a graph showing relationship between the intensity of the light from the test light source after passing through different structures and the viewing angle.

FIG. 10 is a graph showing the relationship between the intensity of the light from the test light source after passing through different structures and the viewing angle, in which a horizontal axis represents the viewing angle and a vertical axis represents the normalized light intensity. The test light source is a light source for testing, and specifically may be an LED, an OLED, or the like. The light emitted by the test light source is blue light. The multiple curves in FIG. 10 are respectively represented as: a relation curve between the intensity of light from the test light source and the viewing angle, a relation curve between the intensity of light from the test light source after passing through the red light emitting portion 31r and the viewing angle, and a relation curve between the intensity of light from the test light source after passing through the green light emitting portion 31g and the viewing angle. The red light emitting portion 31r and the green light emitting portion 31g have shapes as shown in FIG. 9. As can be seen from FIG. 10, the intensity of light emitted from the test light source is larger at the front viewing angle, and the intensity of light decreases rapidly as the viewing angle increases. After passing through each light emitting portion 31, the intensity of light does not change much at different viewing angles.

Figure 11:
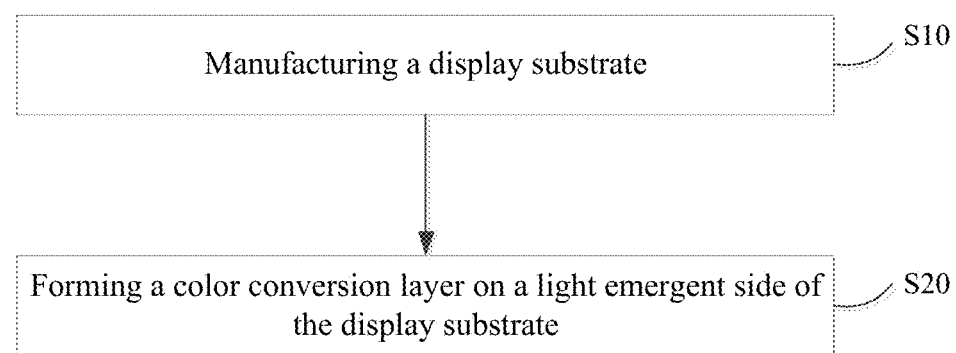
FIG. 11 is a flow chart of a method of manufacturing a display panel according to an embodiment of the present disclosure.

The embodiments of the present disclosure further provide a method of manufacturing the display panel described above, and FIG. 11 is a flow chart of the method of manufacturing the display panel in an embodiment of the present disclosure. As shown in FIG. 11, the method of manufacturing the display panel includes steps S10 and S20.

In step S10, a display substrate is manufactured, which may be the display substrate in the above embodiments.

In step S20, a color conversion layer is formed on the light emergent side of the display substrate, the color conversion layer includes a plurality of repeating units, each repeating unit includes a plurality of light emitting portions, each light emitting device corresponds to one light emitting portion, and the light emitting portion is configured to receive light emitted by a corresponding light emitting device and emit light having a same color as or different color from a preset color. Optionally, colors of light emitted by the plurality of light emitting portions in a same repeating unit are different from each other.

Figure 12:
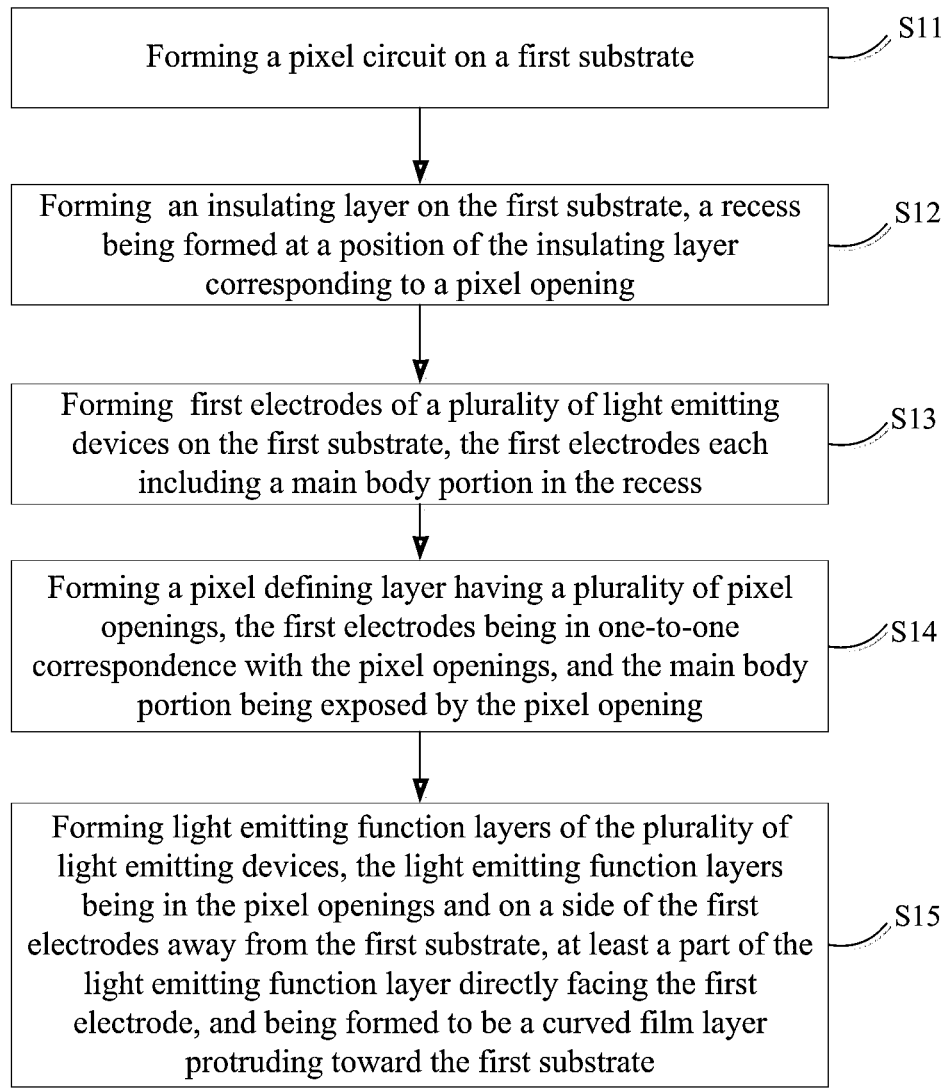
FIG. 12 is a flow chart of an optional implementation of step S10.

FIG. 12 is a flow chart of an optional implementation of step S10, and as shown in FIG. 12, step S10 includes steps S11 to S15.

In step S11, a pixel circuit is formed on a first substrate.

In step S12, an insulating layer is formed on the first substrate, a recess is formed at a position of the insulating layer corresponding to a pixel opening, and a via hole is further formed in the insulating layer, so that the first electrode formed subsequently may be connected to the drain electrode of the thin film transistor through the via hole.

Figure 13A:
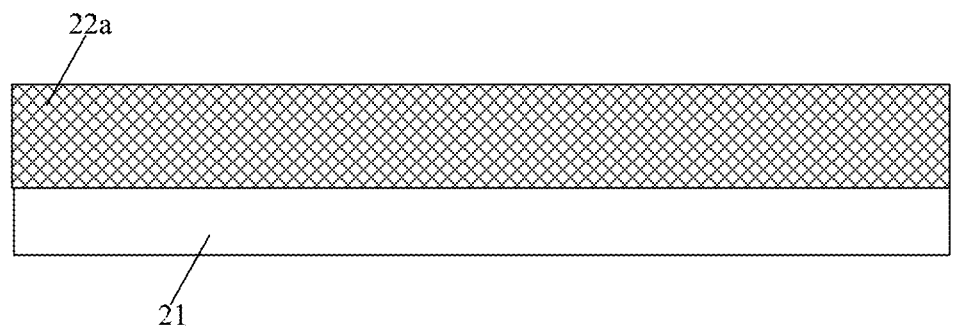
FIGS. 13A to 13C are schematic diagrams showing a process of fabricating an insulating layer having a recess in some embodiments of the present disclosure.
Figure 13B:
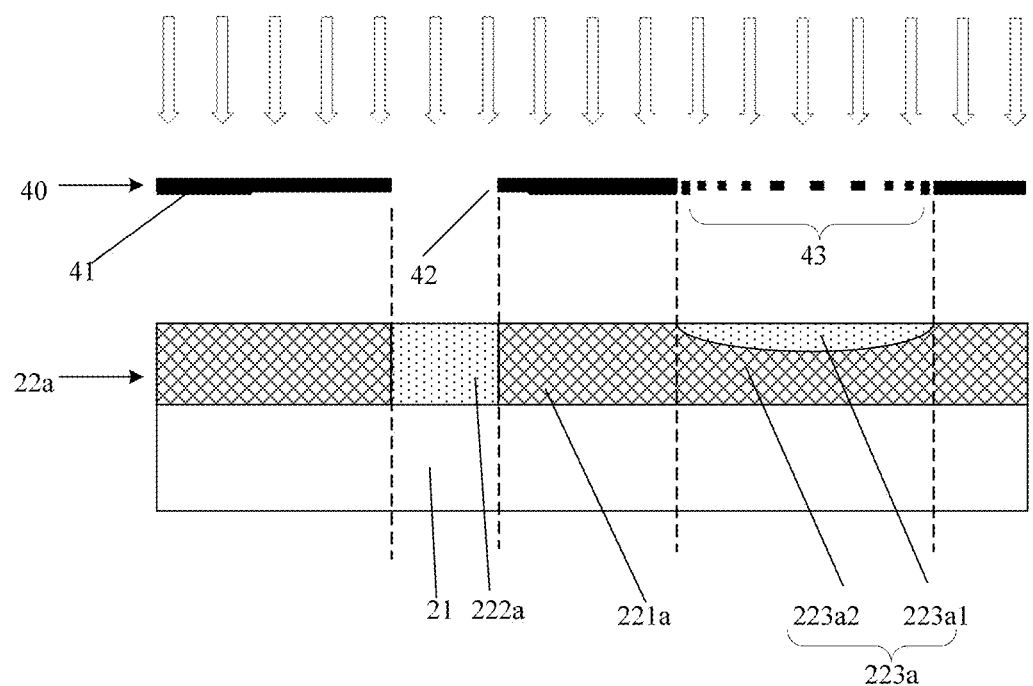
Figure 13C:
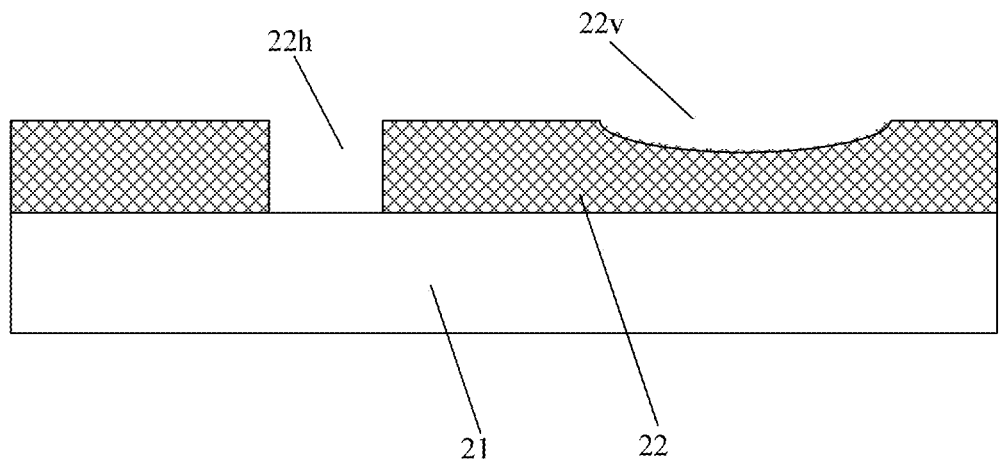

FIGS. 13A to 13C are schematic diagrams showing a process of forming an insulating layer having a recess in some embodiments of the present disclosure, and as shown in FIGS. 13A to 13C, the process of forming the insulating layer having the recess includes steps S12a to S12c.

In step S12a, as shown in FIG. 13A, an insulating material layer 22a is formed, and the insulating material layer 22a may be a positive photosensitive material layer.

In step S12b, as shown in FIG. 13B, step exposure is performed on the insulating material layer 22a by using a mask 40 (for example, a half-tone mask), an unexposed portion 221a, a completely exposed portion 222a and a partially exposed portion 223a are formed after the insulating material layer 22a is exposed, the completely exposed portion 222a is an area where a via hole is to be formed, and the partially exposed portion 223a is an area where a recess is to be formed, and includes an exposed sub-portion 223a1 and an unexposed sub-portion 223a2. The mask 40 includes a light-shielding region 41, a completely light-transmitting region 42 and a partially light-transmitting region 43. The light-shielding region 41 corresponds to the unexposed portion 221a, the completely light-transmitting region 42 corresponds to the completely exposed portion 222a, and the partially light-transmitting region 43 corresponds to the partially exposed portion 223a.

In step S12c, as shown in FIG. 13C, the exposed insulating material layer 22a is developed to: remove the completely exposed portion 222a to form the via hole 22h; remove the exposed sub-portion 223a1 in the partially exposed portion 223a to form the recess 22v; and reserve the unexposed portion 221a and the unexposed sub-portion 223a2 in the partially exposed portion 223a. In this way, the developed insulating material layer is formed into the insulating layer 22 having the recess 22v.

The amount of light transmitting through the partially light-transmitting region 43 gradually increases from the edge to the middle of the partially light-transmitting region 43 of the mask 40, so that the exposure degree in the middle of the partially exposed portion 223a is the maximum; the farther from the middle, the smaller the exposure degree of the partially exposed portion. Thus, in the recess 22v formed at the end of development, the closer to the middle of the recess 22v, the greater the depth.

Step S12 is followed by steps S13 to S15.

In step S13, first electrodes of a plurality of light emitting devices are formed on the first substrate, the first electrodes including main body portions located in the recesses.

In step S14, a pixel defining layer having a plurality of pixel openings is formed, the first electrodes are in one-to-one correspondence with the pixel openings, and the main body portions are exposed by the pixel openings.

In step S15, light emitting function layers of the plurality of light emitting devices are formed, the light emitting function layers are located in the pixel openings and on a side of the first electrodes away from the first substrate, at least a part of the light emitting function layer directly faces the first electrode, and the part of the light emitting function layer directly facing the first electrode is attached to the first electrode and located in the recess to form a curved film layer protruding toward the first substrate.

Optionally, the light emitting function layer includes film layers such as a hole injection layer, a hole transport layer, a light emitting layer, an electron transport layer, and an electron injection layer, and each film layer may be formed by an evaporation process, so that the thickness of each film layer is uniform.

Figure 14:
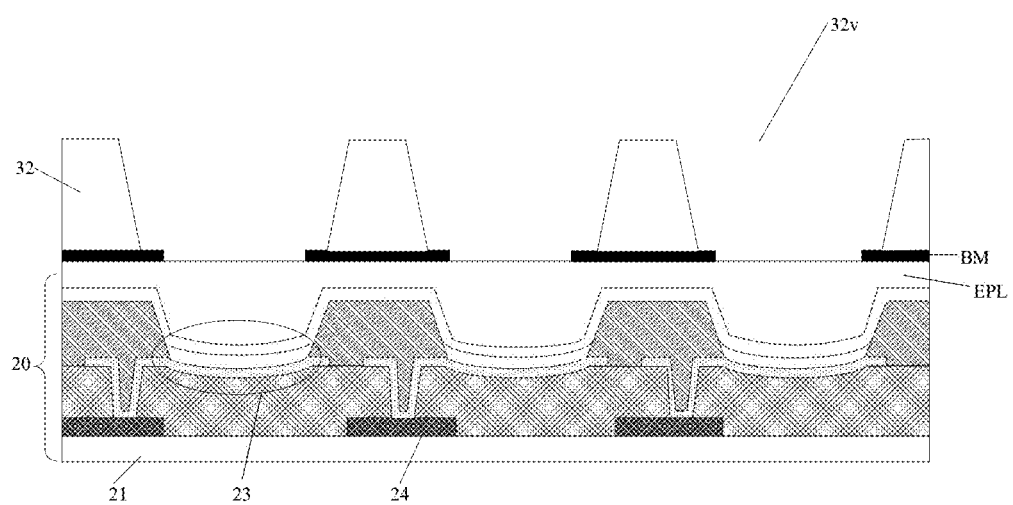
FIGS. 14 to 15 are schematic diagrams showing a process of step S20 in some embodiments of the present disclosure.
Figure 15:
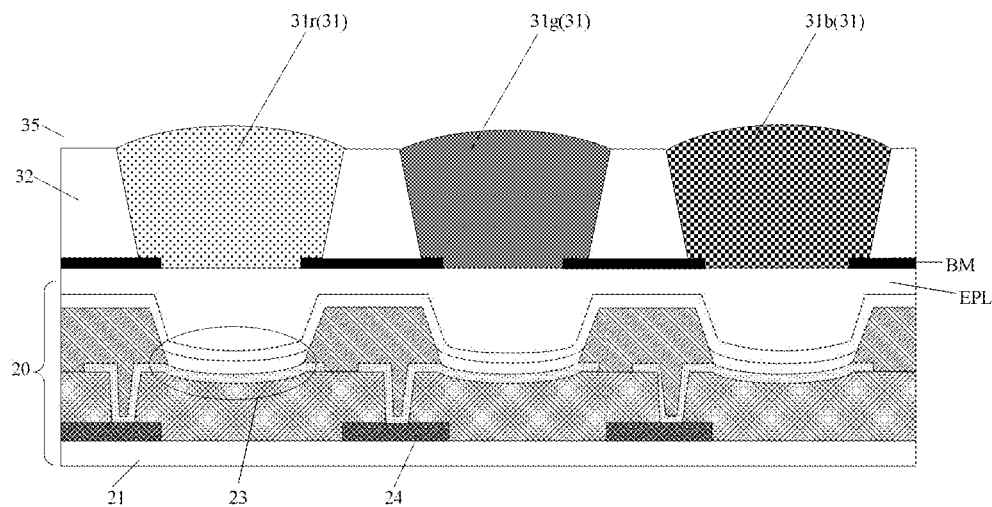

FIGS. 14 to 15 are schematic diagrams showing a process of step S20 in some embodiments of the present disclosure, and as shown in FIGS. 14 to 15, step S20 includes steps S21a and S21b.

In step S21a, as shown in FIG. 14, an accommodating structure layer 32 is formed on the light emergent side of the display substrate 20, the accommodating structure layer 32 has a plurality of accommodating grooves 32v, and the plurality of accommodating grooves 32v are in one-to-one correspondence with the plurality of light emitting devices 23.

In some embodiments, the accommodating structure layer 32 is made of a hydrophobic material.

In step S21b, as shown in FIG. 15, a light emitting portion 31 is formed in each accommodating groove 32v by ink-jet printing. The preset color is blue, and the plurality of light emitting portions 31 in a same repeating unit include: a red light emitting portion 31r, a green light emitting portion 31g, and a blue light emitting portion 31b; a material of the red light emitting portion 31r includes a red quantum dot material, a material of the green light emitting portion 31g includes a green quantum dot material, and a material of the blue light emitting portion 31b includes a scattering particle material.

Optionally, the material of the red light emitting portion 31r includes a red quantum dot material and a scattering particle material, the material of the green light emitting portion 31g includes a green quantum dot material and a scattering particle material, and the material of the blue light emitting portion 31b includes a scattering particle material. Step S21b may specifically include: ink-jet printing a first solution into the accommodating groove 32v in which the red light emitting portion 31r is to be formed, ink-jet printing a second solution into the accommodating groove 32v in which the green light emitting portion 31g is to be formed, and ink-jet printing a third solution into the accommodating groove 32v in which the blue light emitting portion 31b is to be formed; the first solution contains the red quantum dot material and the scattering particle material, the second solution contains the green quantum dot material and the scattering particle material, and the third solution contains the scattering particle material. A volume of the solution printed into each accommodating groove 32v is larger than a volume of the accommodating groove 32v. Thereafter, the solution in the accommodating groove 32v is cured, thereby forming the plurality of light emitting portions 31. Since the accommodating structure layer 32 is made of a hydrophobic material, the middle of the solution formed in the accommodating groove 32v bulges upward, so that the surface, away from the display substrate 20, of the light emitting portion 31 formed by curing is formed into a convex surface.

Optionally, before step S20, a black matrix BM may be also formed on the display substrate 20, and the black matrix BM may be formed on an encapsulation layer EPL of the display substrate 20. After step S20, a filling layer, a color filter layer, and a protective layer may also be formed sequentially on the side of the color conversion layer away from the display substrate 20.

Figure 16A:
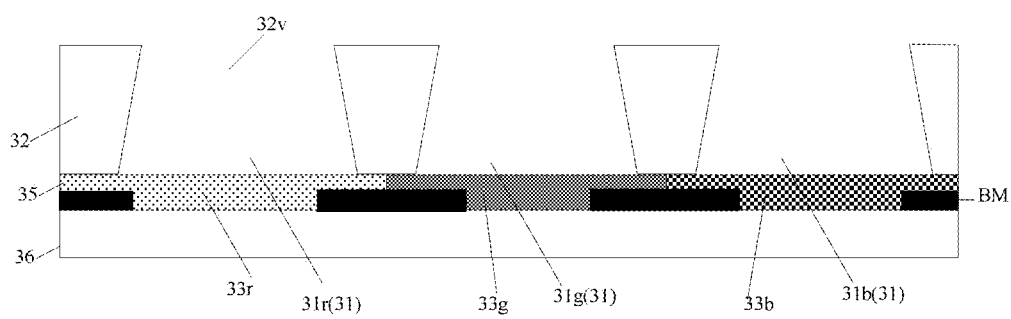
FIGS. 16A to 16C are schematic diagrams showing a process of step S20 in some other embodiments of the present disclosure.
Figure 16B:
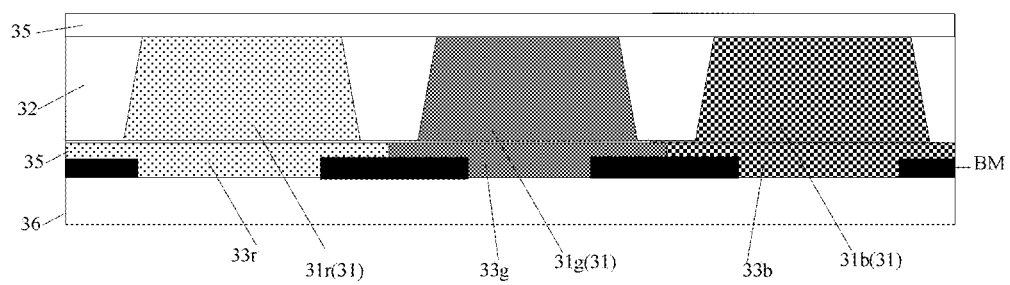
Figure 16C:
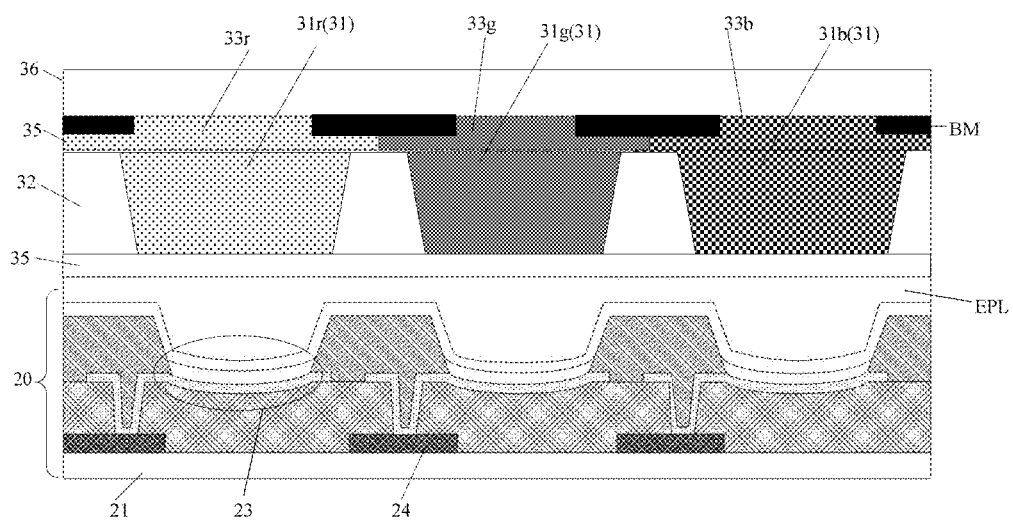

FIGS. 16A to 16C are schematic diagrams showing a process of step S20 in some other embodiment of the present disclosure, and as shown in FIGS. 16A to 16C, step S20 includes steps S22a to S22c.

In step S22a, as shown in FIG. 16A, an accommodating structure layer 32 is formed on a second substrate 36, the accommodating structure layer 32 has a plurality of accommodating grooves 32v, and the plurality of accommodating grooves 32v are in one-to-one correspondence with the plurality of light emitting devices. The second substrate 32 may be a glass substrate, or may be a flexible substrate made of a flexible material such as polyimide.

In step S22b, as shown in FIG. 16B, a light emitting portion 31 is formed in each accommodating groove 32v by ink-jet printing; the color of light emitted by the light emitting device is blue, and the plurality of light emitting portions 31 in a same repeating unit include: a red light emitting portion 31r, a green light emitting portion 31g, and a blue light emitting portion 31b; a material of the red light emitting portion 31r includes a red quantum dot material, a material of the green light emitting portion 31g includes a green quantum dot material, and a material of the blue light emitting portion 31b includes a scattering particle material.

In step S22c, as shown in FIG. 16C, the second substrate 36 and the display substrate 20 are aligned to form a cell, such that the light emitting portion 31 is aligned with the corresponding light emitting device 23. Here, the expression "the light emitting portion 31 is aligned with the corresponding light emitting device 23" means that an orthographic projection of the light emitting portion 31 at least partially overlaps with an orthographic projection of the corresponding light emitting device 23 on the first substrate 21, for example, the center of the light emitting portion 31 is aligned with the center of the light emitting device 23.

In addition, before the accommodating structure layer 32 is formed on the second substrate 36, a color filter layer including a red filter portion 33r corresponding to the red light emitting portion 31r, a green filter portion 33g corresponding to the green light emitting portion 31g and a blue filter portion 33b corresponding to the blue light emitting portion 31b, and a black matrix BM may be formed on the second substrate 36.

The embodiments of the present disclosure further provide a display device, which includes the display panel in the above embodiments. The display device may be any product or component with a display function, such as an OLED panel, a QLED display panel, a mobile phone, a tablet computer, a television, a display, a notebook computer, a digital photo frame, a navigator or the like.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A display panel comprising a display substrate and a color conversion layer on a light emergent side of the display substrate,
   wherein the display substrate comprises:
   a first substrate;
   a pixel defining layer on the first substrate, the pixel defining layer having a plurality of pixel openings; and
   a plurality of light emitting devices in one-to-one correspondence with the plurality of pixel openings and configured to emit light of a preset color, wherein the light emitting device comprises a first electrode and a light emitting function layer, the first electrode is between the pixel defining layer and the first substrate, and comprises a main body portion exposed by the pixel opening; the light emitting function layer is in the pixel opening and on a side of the main body portion away from the first substrate, at least a part of the light emitting function layer directly faces the main body portion, and the part of the light emitting function layer directly facing the main body portion is a curved film layer protruding towards the first substrate,
   wherein the color conversion layer comprises a plurality of repeating units, each repeating unit comprises a plurality of light emitting portions, each light emitting device corresponds to one light emitting portion, and the light emitting portion is configured to receive light emitted by a corresponding light emitting device and emit light with a same color as or a different color from the preset color,
   wherein the color conversion layer is provided therein with scattering particles.

2. The display substrate of claim 1, wherein the display substrate further comprises an insulating layer between the pixel defining layer and the first substrate, and a recess is disposed on the insulating layer at a position corresponding to the pixel opening; and
   the main body portion and the light emitting function layer are both in the recess.

3. The display substrate of claim 2, wherein an inner surface of the recess is an arc-shaped surface, and an included angle between a line from a center to an edge of the inner surface and a thickness direction of the display substrate is greater than 60°.

4. The display substrate of claim 2, wherein an orthographic projection of the light emitting function layer on the first substrate is within an orthographic projection of the recess on the first substrate.

5. The display substrate of claim 2, wherein the light emitting device further comprises a second electrode on a side of the light emitting function layer away from the first substrate;
   the display substrate further comprises:
   a thin film transistor between the insulating layer and the first substrate, wherein the first electrode is connected to the thin film transistor through a via hole in the insulating layer, and
   an encapsulation layer covering the pixel defining layer and the plurality of light emitting devices.

6. The display panel of claim 1, wherein the preset color is blue, and the plurality of light emitting portions in a same repeating unit comprise: a red light emitting portion, a green light emitting portion and a blue light emitting portion, a material of the red light emitting portion comprises a red quantum dot material, a material of the green light emitting portion comprises a green quantum dot material, and a material of the blue light emitting portion comprises a scattering particle material.

7. The display panel of claim 1, wherein a surface of the light emitting portion away from the display substrate is a convex surface.

8. The display panel of claim 1, wherein an accommodating structure layer is further disposed on the light emergent side of the display substrate, the accommodating structure layer has a plurality of accommodating grooves, the plurality of accommodating grooves are in one-to-one correspondence with the plurality of light emitting devices, and the plurality of light emitting portions are in the plurality of accommodating grooves.

9. The display panel of claim 8, wherein a portion of the accommodating structure layer that is in contact with the light emitting portion is made of a hydrophobic material.

10. The display panel of claim 8, further comprising:
    a color filter layer on a side of the color conversion layer away from the display substrate, wherein the color filter layer comprises a plurality of color filter portions, the plurality of color filter portions are in one-to-one correspondence with the plurality of light emitting portions, and color of the color filter portion is the same as color of light emitted from a corresponding light emitting portion; and
a black matrix between the accommodating structure layer and the display substrate or on a side of the color conversion layer away from the display substrate; wherein an orthographic projection of at least a part of each light emitting portion on the first substrate does not overlap with an orthographic projection of the black matrix on the first substrate.

11. A method of manufacturing a display panel, comprising:
manufacturing a display substrate, wherein manufacturing a display substrate comprises:
forming first electrodes of a plurality of light emitting devices on a first substrate, the first electrodes each comprising a main body portion;
forming a pixel defining layer, wherein the pixel defining layer has a plurality of pixel openings, the first electrodes are in one-to-one correspondence with the plurality of pixel openings, and the main body portion is exposed by the pixel opening; and
forming light emitting function layers of the plurality of the light emitting devices, wherein the light emitting function layers are in the pixel openings and on a side of the main body portions away from the first substrate, at least a part of the light emitting function layer directly faces the main body portion, and the part of the light emitting function layer directly facing the main body portion is a curved film layer protruding toward the first substrate; and
the method further comprises:
forming a color conversion layer on a light emergent side of the display substrate, wherein the color conversion layer comprises a plurality of repeating units, each repeating unit comprises a plurality of light emitting portions, each light emitting device corresponds to one light emitting portion, and the light emitting portion is configured to receive light emitted by a corresponding light emitting device and emit light with a same color as or a different color from the preset color, and wherein the color conversion layer is provided therein with scattering particles.

12. The method of claim 11, wherein manufacturing a display substrate further comprises:
before forming first electrodes of a plurality of light emitting devices, forming an insulating layer on the first substrate, wherein a recess is formed on the insulating layer at a position corresponding to the pixel opening;
wherein the main body portion and the light emitting function layer are both in the recess.

13. The method of claim 11, wherein forming a color conversion layer on a light emergent side of the display substrate comprises:
forming an accommodating structure layer on the light emergent side of the display substrate, wherein the accommodating structure layer has a plurality of accommodating grooves, and the plurality of accommodating grooves are in one-to-one correspondence with the plurality of light emitting devices; and
forming a light emitting portion in each accommodating groove by ink-jet printing;
wherein the preset color is blue, and the plurality of light emitting portions in a same repeating unit comprise: a red light emitting portion, a green light emitting portion and a blue light emitting portion; a material of the red light emitting portion comprises a red quantum dot material, a material of the green light emitting portion comprises a green quantum dot material, and a material of the blue light emitting portion comprises a scattering particle material.

14. The method of claim 13, wherein the accommodating structure layer is made of a hydrophobic material, so that a surface of the light emitting portion away from the display substrate is formed to be a convex surface.

15. The method of claim 11, wherein forming a color conversion layer on a light emergent side of the display substrate comprises:
forming an accommodating structure layer on a second substrate, wherein the accommodating structure layer has a plurality of accommodating grooves, and the plurality of accommodating grooves are in one-to-one correspondence with the plurality of light emitting devices;
forming a light emitting portion in each accommodating groove by ink-jet printing; wherein the preset color is blue, and the plurality of light emitting portions in a same repeating unit comprise: a red light emitting portion, a green light emitting portion and a blue light emitting portion; a material of the red light emitting portion comprises a red quantum dot material, a material of the green light emitting portion comprises a green quantum dot material, and a material of the blue light emitting portion comprises a scattering particle material; and
aligning the second substrate and the display substrate to form a cell, such that the light emitting portion is aligned with a corresponding light emitting device.

16. A display device, comprising the display panel of claim 1.

* * * * *